US006855640B2

(12) United States Patent
Wang et al.

(10) Patent No.: US 6,855,640 B2
(45) Date of Patent: Feb. 15, 2005

(54) APPARATUS AND PROCESS FOR BULK WET ETCH WITH LEAKAGE PROTECTION

(75) Inventors: Zhe Wang, Singapore (SG); Qingxin Zhang, Singapore (SG); Pang Dow Foo, Singapore (SG); Hanhua Feng, Singapore (SG)

(73) Assignee: Institute of Microelectronics, Singapore (SG)

( * ) Notice: Subject to any disclaimer, the term of this patent is extended or adjusted under 35 U.S.C. 154(b) by 333 days.

(21) Appl. No.: 10/083,990

(22) Filed: Feb. 26, 2002

(65) Prior Publication Data

US 2003/0160022 A1 Aug. 28, 2003

(51) Int. Cl.[7] .............................. H01L 21/302
(52) U.S. Cl. ................... 438/745; 438/747; 438/748; 438/753
(58) Field of Search ............................ 438/745, 747, 438/748, 753

(56) References Cited

U.S. PATENT DOCUMENTS

| 5,338,416 | A | | 8/1994 | Mlcak et al. ............ 204/129.3 |
|---|---|---|---|---|
| 5,879,572 | A | | 3/1999 | Folsom et al. ................ 216/49 |
| 5,891,354 | A | * | 4/1999 | Lee et al. ...................... 216/99 |
| 6,025,278 | A | | 2/2000 | Rolfson ...................... 438/745 |
| 6,187,690 | B1 | * | 2/2001 | Rolfson ...................... 438/745 |
| 6,428,718 | B1 | * | 8/2002 | Birdsley et al. .............. 216/84 |
| 6,683,007 | B1 | * | 1/2004 | Yamasaki et al. ........... 438/745 |
| 2002/0060202 | A1 | * | 5/2002 | Fukunaga et al. ............ 216/88 |

* cited by examiner

Primary Examiner—Duy-Vu Deo
(74) Attorney, Agent, or Firm—George D. Saile; Stephen B. Ackerman

(57) ABSTRACT

When using hot alkaline etchants such as KOH, the wafer front side, where various devices and/or circuits are located, must be isolated from any contact with the etchant. This has been achieved by using two chambers that are separated from each other by the wafer that is to be etched. Etching solution in one chamber is in contact with the wafer's back surface while deionized water in the other chamber contacts the front surface. The relative liquid pressures in the chambers is arranged to be slightly higher in the chamber of the front surface so that leakage of etchant through a pin hole from back surface to front surface does not occur. As a further precaution, a monitor to detect the etchant is located in the DI water so that, if need be, etching can be terminated before irreparable damage is done.

11 Claims, 1 Drawing Sheet

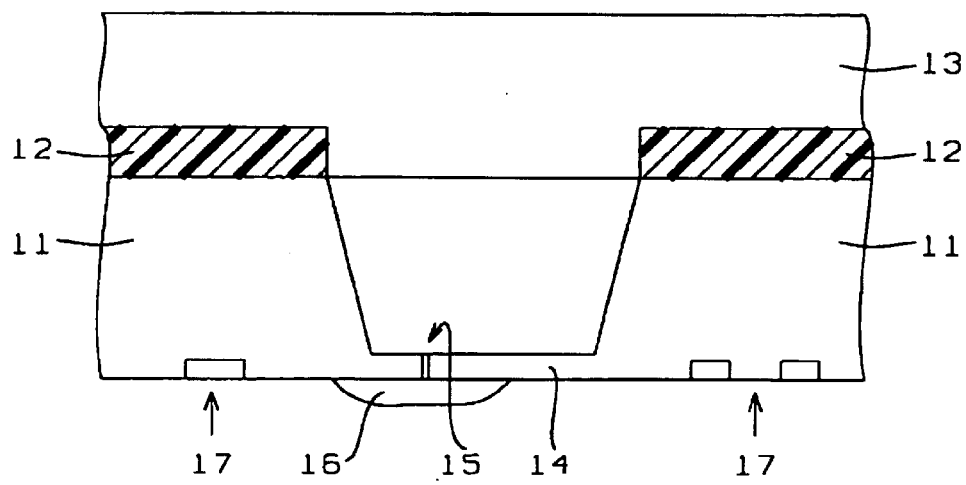
FIG. 1 — Prior Art
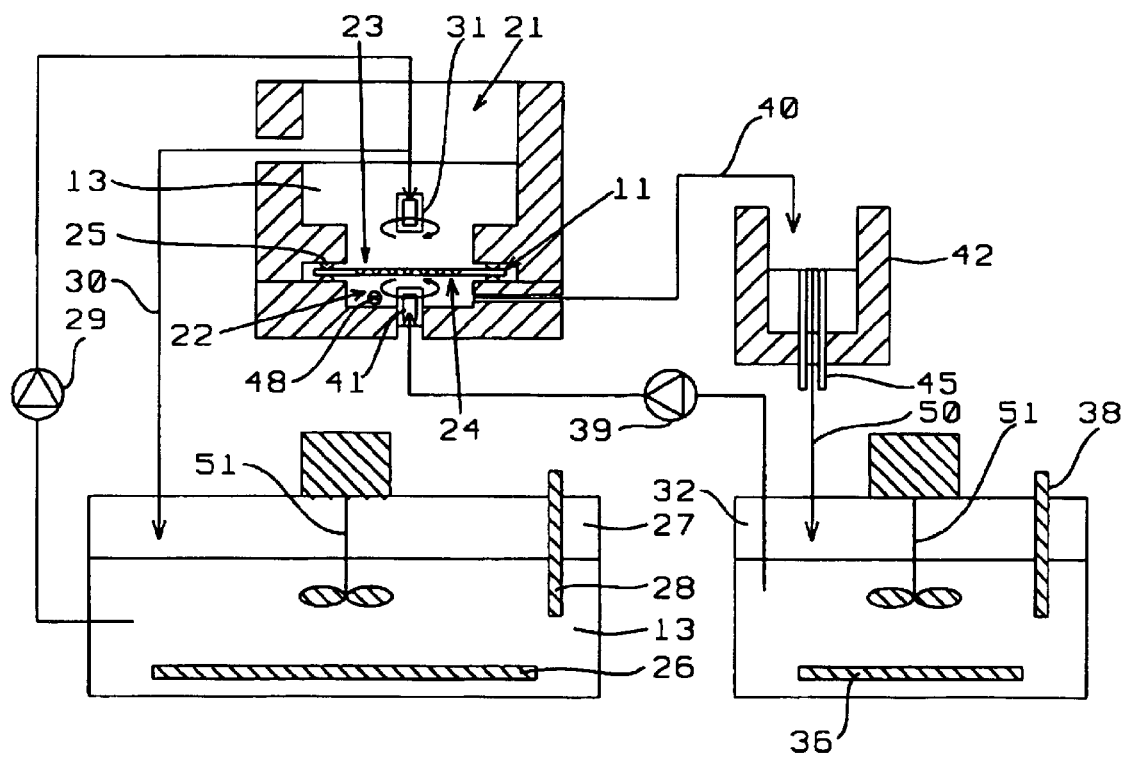
FIG. 2

APPARATUS AND PROCESS FOR BULK WET ETCH WITH LEAKAGE PROTECTION

FIELD OF THE INVENTION

The invention relates to the general field of microelectronics with particular reference to forming thin membranes using corrosive etches.

BACKGROUND OF THE INVENTION

Referring now to FIG. 1, bulk wet etching is a commonly used process for creating a thin membrane (such as 14) or through-holes in silicon wafer 11 by using a hot alkaline etchant 13, such as KOH, TMAH (tetramethyl ammonium hydroxide), EDP (ethylene diamine pyrocatechol), etc. In this process, the wafer front side, where various devices and/or circuits 17 are located, must be isolated from any contact with the etchant. However, due to non-uniformity of etching and/or defects of the backside etching mask 12, it is not unusual, when the etching process is close to its end, for the etchant to leak through perforations in the wafer (such as 15) to attack the front side (see 16). There is, therefore, a need in the bulk wet etching art to be able to ensure not only etching uniformity but also leakage protection.

A number of methods and apparatuses have been invented to implement wet etching of silicon wafers, including those that incorporate various etch stop mechanisms, but little attention has been paid to the protection of wafers in case of leakage. Two typical techniques to prevent wafers from being attacked by etchant leakage are leakage detection and front side coating with etch resistant materials.

Leakage detection. This method uses electrodes or sensors to detect the presence of any alkaline etchant on the wafer front side. Once a leak is detected, the etching process is immediately aborted. However, in practice, it is found that leaks start from tiny pin holes and gradually spread over the wafer front side through capillary action and surface tension forces. It is often too late by the time a sufficient amount of leakage has occurred to be detected. This has resulted in the loss/scrapping of a number of wafers in production lines. In addition, aborting the etching process each time a leakage detector is triggered can bring operational difficulties and risks of wafer breakage.

Front side coating. In this approach, the wafer front side is coated with material that is resistant to the etchant. After the etching process, this coating is removed using an appropriate solvent. Typical coating materials are wax-based but some wax-based materials have properties that are incompatible with device processing or with the devices themselves and are therefore not permitted in a clean room. For example, methyl benzene, the solvent for removal of black wax, may not be used in most countries because it is hazardous to human health. Additional disadvantages reside in their cumbersome coating and removal processing. Furthermore, the coverage provided by the wax coating tends to be inadequate when the wafer front side is non-planar, containing stepped layers of different heights. In these cases, the leaked etchant can still spread out and attack the devices covered by the wax coating through undercutting.

A routine search of the prior art was performed with the following references of interest being found:

In U.S. Pat. No. 5,879,572, Folsom et al. show a bulk wet etch method while U.S. Pat. No. 5,338,416 (Mlcak et al.) shows a related etch process. Rolfson, in U.S. Pat. No. 6,025,278, shows a bulk wet etch process and apparatus in which the presence of etchant on the front side of the wafer is monitored and used to terminate etching once etch-through of via holes through the wafer has been achieved. By definition, no steps can be taken to prevent etch-through (as is done in the present invention). We note the following significant differences between this reference and the present invention:

As noted above, Rolfson is for end-point detection only and provides no protection to devices in the event of leakage. In the present invention the inert liquid (DI water) will dilute and remove any etchant leak so that devices are protected during the brief period between leakage detection and termination of etching.

In Rolfson, the inert and etchant liquids will exchange and/or mix at the end of wafer etching, whereas in the present invention the two liquids are made flow on the wafer surface for etching uniformity and leakage protection.

In Rolfson, the two liquids may be stagnant whereas in the present invention the etchant can be re-used since the inert liquid does not enter the etchant in case of leakage.

In Rolfson, neither liquid can be reused since they become mixed, thereby changing their properties.

In the present invention, liquids in the two chambers have independent flow rates and temperatures and maintain the same pressure on opposite sides of a wafer. This is not true for the Rolfson invention.

SUMMARY OF THE INVENTION

It has been an object of at least one embodiment of the present invention to provide an apparatus for etching the back surface of a wafer while at the same time preventing any leakage of etchant to the front surface.

Another object of at least one embodiment of the present invention has been to detect such leakage in the unlikely event that it occurs.

Still another object of at least one embodiment of the present invention has been to ensure uniform etching of said back surface.

A further object of at least one embodiment of the present invention has been to provide a process for use with said apparatus.

These objects have been achieved by using two chambers that are separated from each other by the wafer that is to be etched. Etching solution in one chamber is in contact with the back surface while deionized water in the other chamber contacts the front surface. The relative liquid pressures in the chambers is arranged to be equal in the chamber of the front surface so that leakage of etchant through a pin hole from back surface to front surface does not occur. As a further precaution, a monitor to detect the etchant is located in the DI water so that, if need be, etching can be terminated before irreparable damage is done.

BRIEF DESCRIPTION OF THE DRAWINGS

FIG. 1 illustrates how etchant may leak onto the front surface of a wafer while its back surface is being etched.

FIG. 2 illustrates the apparatus of the present invention.

DESCRIPTION OF THE PREFERRED EMBODIMENTS

The invention is a novel apparatus to make the wafer bulk etching process an easy-to use, seamless and hassle-free procedure. In the description that follows the commonly used KOH etching process is assumed, but it will be realized that the invention is more general than that and could be applied to any situation where a material, such as any semiconductor, is to be etched from one side to form etch-through holes or very thin membranes, while leaving an opposite side free of attack by the etchant.

At the beginning of the etching process, hot KOH solution is pumped into the process chamber to etch the back side of the wafer. In order to have uniform etching across the wafer surface, the KOH flow pattern must be made turbulent. So, the KOH solution is ejected out at some speed in random directions from its shower head. This turbulent flow also facilitates rapid removal of hydrogen bubbles generated by the etching reaction. An overflow hole on the upper part of the process chamber allows KOH to flow back the KOH tank. When etching is close to the end (this can be estimated from the etching rate), hot DI water (at the same temperature as the KOH) starts to be pumped into the enclosed chamber on the front side of the wafer. The water flow here is also made turbulent such that no air bubbles accumulate and attach to the wafer surface. To avoid any damage to fragile parts of the wafer, the water injections from the showering should not be directed to the wafer. After flushing the wafer surface, the hot DI water is purged out through a short tube to the water reflow tank and then flow back to the hot water tank. To balance the pressures on both sides of the wafer, the outlet of the short tube should be slightly lower in height that the overflow hole on the process chamber. In addition, the water flow should be kept at a relatively low rate so that the pressure difference to drive the water flow is as low as possible.

The essence of the above scheme is to use clean water to dilute and take away any KOH leaks from the wafer front side. The purity of water can be monitored in the water flow tank by using a pH meter. Too high a pH value indicates either a large amount of KOH leakage or a contaminated wafer. In either of these case the etching process should not continue any further.

Referring now to FIG. 2, seen there is a schematic diagram of the apparatus of the present invention. The heart of the apparatus is in the two chambers 21 and 22 that are separated from each other by silicon wafer 11 so that the latter's back surface 23 is part of chamber 21 and its front surface 24 is part of chamber 22. Seals 25 serve to prevent liquid from flowing between these chambers. Generally, wafer 11 will have a diameter between about 10 and 20 cm and a thickness between about 0.5 and 0.72 mm.

A solution of potassium hydroxide 13 is stored in tank 27 where it is maintained at a temperature between about 60 and 90° C. by heater 26 controlled by thermocouple 28. Tank 27 is connected to chamber 21 through pump 29 path, a return path being provided by etchant return path 30. The potassium hydroxide solution flow rate is between about 500 and 2,00 sccm. The connection from pump 29 into chamber 21 terminates at shower head 31 that emits the potassium hydroxide solution in a direction that is parallel to back surface 23 while at the same time rotating. This is a key feature of the design since it induces turbulence in the KOH solution which in turn ensures the rapid removal of any bubbles (primarily hydrogen) that form at back surface 23.

The main source of deionized water is tank 32 which is maintained at a temperature between about 60 and 90° C. by heater 36 controlled by thermocouple 38. Tank 32 is connected to chamber 22 through pump 39. The connection from pump 39 into chamber 22 terminates at shower head 41 that emits deionized water in a direction that is parallel to front surface 24 while at the same time rotating. This is also a key feature of the design since it induces turbulence in the DI water which in turn ensures the rapid removal of any bubbles (primarily air) that may form at front surface 24.

Deionized water leaves chamber 22 through path 40 but does not return directly return tank 32. Instead, it is connected to water reflow tank 42 which provides the means for introducing a difference in pressure between the two liquids that are on opposite sides of the wafer. This is accomplished by causing liquid in water reflow tank 42 to leave through high flow impedance tube 45 that extends for some distance into tank 42. The height of the KOH solution above the wafer should be from 5 to 10 cm. The hydrostatic pressure of the KOH solution at the wafer surface can be balanced by that of the deionized water at the wafer surface. This balance is readily accomplished by raising or lowering tank 42 relative to 22.

A third important feature is the presence in chamber 22 of detector 48 for potassium hydroxide. While in principle this could be any suitable detector, in practice it is most convenient to employ a pH meter for detector 48. In general, etching is terminated whenever the pH measured by 48 said pH meter exceeds 7.

Also shown in FIG. 2 are stirrers 51 whose purpose is to create uniform heating.

RESULTS

Prior to the adoption of the process and apparatus described above, the wafer yield of KOH etching, in terms of the wafers free from KOH leak attack, varied from 0 to 70%. After implementation of the present invention, the wafer yield increased to 100%.

A comparison between the present invention and the prior art is summarized in TABLE I below:

TABLE I

| FEATURE | LEAK DETECTION | WAX COATING | INVENTION |
| --- | --- | --- | --- |
| Closed flow ckt. | yes | no | yes |
| Leak sensors | yes | yes | no |
| wax removal | no | yes | no |
| wafer protection | poor | fair | excellent |
| process interrupts | highly likely | no | no |
| operational ease | clumsy | clumsy | easy |
| system complexity | complex | simple | complex |

What is claimed is:

1. A process for wet etching a wafer having front and back surfaces, comprising:

at a first pressure, contacting said back surface with a first liquid that etches said wafer;

at a second pressure that is equal to said first pressure, contacting said front surface with a second liquid that does not etch said wafer, whereby leakage of said first liquid to said front surface does not occur; and etching said wafer for a period of time without any part of said front surface getting etched.

2. The process described in claim 1 wherein said wafer is a semiconductor.

3. The process described in claim 1 wherein said wafer has a diameter between about 10 and 20 cm.

4. The process described in claim 1 wherein said wafer has thickness between about 0.5 and 0.725 mm.

5. The process described in claim 1 wherein said first pressure can be balanced by said second pressure.

6. A process for wet etching a silicon wafer having front and back surfaces, comprising:

providing first and second chambers that are separated from each other by said silicon wafer whereby said back surface is part of said first chamber and said front surface is part of said second chamber;

providing seals that prevent liquid from flowing between said chambers;

causing a solution of potassium hydroxide, at a first temperature and pressure, to flow into and out of said first chamber, in a direction parallel to said back surface through a rotating shower head, whereby turbulence is induced in said potassium hydroxide solution thereby removing from said back surface any bubbles that may form there;

causing deionized water, at a second temperature and pressure, to flow into and out of said second chamber in a direction parallel to said front surface through a rotating shower head, whereby turbulence is induced in said deionized water thereby removing any bubbles that may form on said front surface;

monitoring deionized water in said second chamber for the presence of potassium hydroxide; and etching said back surface for a period of time that is insufficient for said potassium hydroxide solution to etch all the way through any part of said silicon wafer.

7. The process described in claim 6 wherein said solution of potassium hydroxide has a concentration between about 30% and 40% by weight.

8. The process described in claim 6 wherein said first temperature is between about 60 and 90° C.

9. The process described in claim 6 wherein said second temperature is between about 60 and 90° C.

10. The process described in claim 6 wherein the step of monitoring deionized water in said second chamber for the presence of potassium hydroxide further comprises measuring the pH.

11. The process described in claim 10 further comprising terminating etching when said pH exceeds 7.

* * * * *